(12) United States Patent
Inoue (10) Patent No.: US 7,272,685 B2
(45) Date of Patent: Sep. 18, 2007

(54) INTEGRATED CIRCUIT WITH ASSOCIATED MEMORY FUNCTION

(75) Inventor: Kazunari Inoue, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 261 days.

(21) Appl. No.: 10/872,771

(22) Filed: Jun. 22, 2004

(65) Prior Publication Data
US 2005/0013299 A1 Jan. 20, 2005

(30) Foreign Application Priority Data
Jun. 27, 2003 (JP) .............................. 2003-185234

(51) Int. Cl.
G06F 12/00 (2006.01)
(52) U.S. Cl. ........................................ 711/108; 365/49
(58) Field of Classification Search ................. 711/108
See application file for complete search history.

(56) References Cited

U.S. PATENT DOCUMENTS 5,619,718 A * 4/1997 Correa ............................ 704/9
6,542,391 B2 4/2003 Pereira et al.
6,892,237 B1 * 5/2005 Gai et al. ..................... 709/224
6,903,953 B2 * 6/2005 Khanna ......................... 365/49
6,993,622 B2 * 1/2006 Khanna et al. ............. 711/108
2004/0030803 A1 * 2/2004 Eatherton et al. ........... 709/245

OTHER PUBLICATIONS

"Network Security Technology: Intrusion Detection System Methodologies" <http://www.cs.usask.ca/undergrads/der850/project/ids/methodologies.shtml>, May 28, 2003, pp. 1-5.
"MOSAID Class-IC™ DC9288 as a Lookup Table for a VLAN Learning Bridge" MOSAID Application Note, May 30, 2002, pp. 1-9.

* cited by examiner

Primary Examiner—Brian R. Peugh
Assistant Examiner—Hashem Farrokh
(74) Attorney, Agent, or Firm—McDermott Will & Emery LLP

(57) ABSTRACT

A search payload data shift part has n latch parts LT1 to LTn (n≧2), each of which can store 1-byte latch data, and obtains search payload data having an n-byte length, while shifting payload data inputted from an input terminal, in synchronization with a clock provided from the exterior. Data related to the search payload data is given to a CAM array, as search object data. When the search object data matches entry data of the CAM array, a hit signal 'hit' indicating a match is outputted from the CAM array.

4 Claims, 11 Drawing Sheets

INTEGRATED CIRCUIT WITH ASSOCIATED MEMORY FUNCTION

BACKGROUND OF THE INVENTION

1. Field of the Invention

The present invention relates to an integrated circuit with associated memory function containing an associated memory such as a content-addressable memory (CAM).

2. Description of Related Art

In routers on networks, associated memories called CAMs are generally used as a routing table describing a media access control (MAC) address. The CAMs are disclosed in, for example, U.S. Pat. No. 6,542,391. Search operation peculiar to the CAMs enables high speed search.

However, the CAM is a mere memory having the function of detecting at high speed as to whether an object to be searched is present or not. Therefore, most processing in a router is executed in a control part such as a network processor unit (NPU) and an application specific integrated circuit (ASIC). The operation share of the control part is extremely large, and too great burden is imposed on the control part. This has caused the problem of having adverse effect on the performance of processing executed by the control part, such as queuing processing in consideration of priority, and accounting processing such as packet logging and statistics creation processing.

SUMMARY OF THE INVENTION

It is an object of the present invention to obtain an integrated circuit with associated memory function enabling to reduce the load imposed on a control part such as an NPU and an ASIC.

According to a first aspect of the present invention, an integrated circuit with associated memory function includes a payload data shift part and an associated memory part.

The payload data shift part receives input data containing payload data and fetches the payload data in a predetermined bit units to obtain search payload data composed of the product of the predetermined bit and a predetermined length while shifting the payload data in the predetermined bit units. The associated memory part stores at least one entry data and outputs a comparison result signal indicating the presence or absence of a match by comparing search object data being data related to the search payload data with the at least one entry data.

This enables the execution of signature matching processing to detect a predetermined character string contained in payload data. As a result, a control part that controls this integrated circuit with associated memory function need not perform signature matching processing, thereby enabling to reduce the load imposed on the control part.

According to a second aspect of the present invention, an integrated circuit with associated memory function includes an associated memory part, a checksum operation part, and a selector.

The associated memory part can store input data as entry data having a predetermined length. The checksum operation part splits the entry data into a plurality of split data, and obtains a checksum operation result of the plurality of split data. The selector can selectively output either of the entry data and the checksum operation result.

A control part that controls this integrated circuit with associated memory function can execute checksum operation processing with an attendant reduction in the load imposed on the control part.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

<Principle>

Payload data corresponding to an information storing portion in packet data corresponds to the data of an application layer located at a network layer of a fourth layer or above in a plurality of network layers. In some cases, a character string to be detected by a fire wall is contained in this payload data. It is important to quickly find this character string and inhibit transit of the packet. Heretofore, intrusion detection system (IDS) function such as fire wall has been assigned to a control part such as an NPU and an ASIC, and signature matching search for searching a character string to be detected from all payload data has thrown an excessively high load on the control part. Hence, this IDS function is intended for incorporating into an integrated circuit with associated memory function in accordance with a first preferred embodiment of the present invention.

Figure 1:
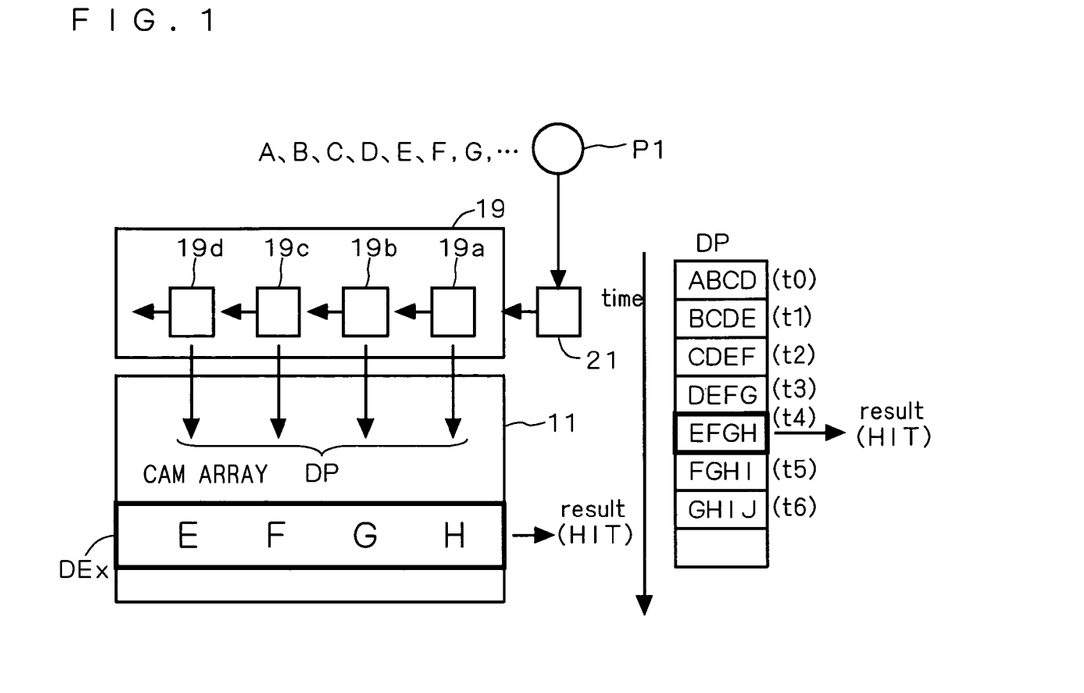
FIG. 1 is a block diagram showing schematically the concept of an integrated circuit with associated memory function in accordance with a first preferred embodiment of the present invention.

FIG. 1 is a block diagram showing schematically the concept of an integrated circuit with associated memory function in accordance with the first preferred embodiment of the present invention.

Referring to FIG. 1, characters A, B, C, D, . . . , each of which is expressed in one byte (8 bits), are inputted serially in 1-byte units to an input terminal P1, and then latched per character by a latch part 21.

A search payload data shift part 19 has four latch parts 19a to 19d, each of which can store 1-byte latch data. The latch parts 19a to 19d execute shift operation in synchronization with a clock (not shown). Specifically, the latch part 19a fetches the latch data of the latch part 21, and the latch parts 19b to 19d fetch the latch data of the latch parts 19a to 19c, respectively. Data of 4-byte (1-byte (8 bits) (a predetermined bit) ×4 (a predetermined length)), which is latched by the latch parts 19a to 19d within the search payload data shift part 19, becomes search payload data DP.

On the other hand, a CAM array 11 can store a plurality of at least 4-byte entry data DE. In this example, assume that an entry data DEx, one of the entry data DE, is a character string of "EFGH."

As shown in FIG. 1, when the payload data are inputted in the order named: A, B, C, D, E, F, G, H, . . . , to the input terminal P1, the search payload data DP becomes a character string "ABCD" at time t0 at which the character "A" is latched by the latch part 19d. Thereafter, time t1 to time t6 will elapse in synchronization with the clock. At the time t4, the search payload data DP becomes "EFGH" that matches the entry data DEx (HIT). The first preferred embodiment has this matching information to be contained in a comparison result signal 'result' and outputted to the exterior, thereby incorporating the signature matching search function into the integrated circuit with associated memory function.

<Configuration>

Figure 2:
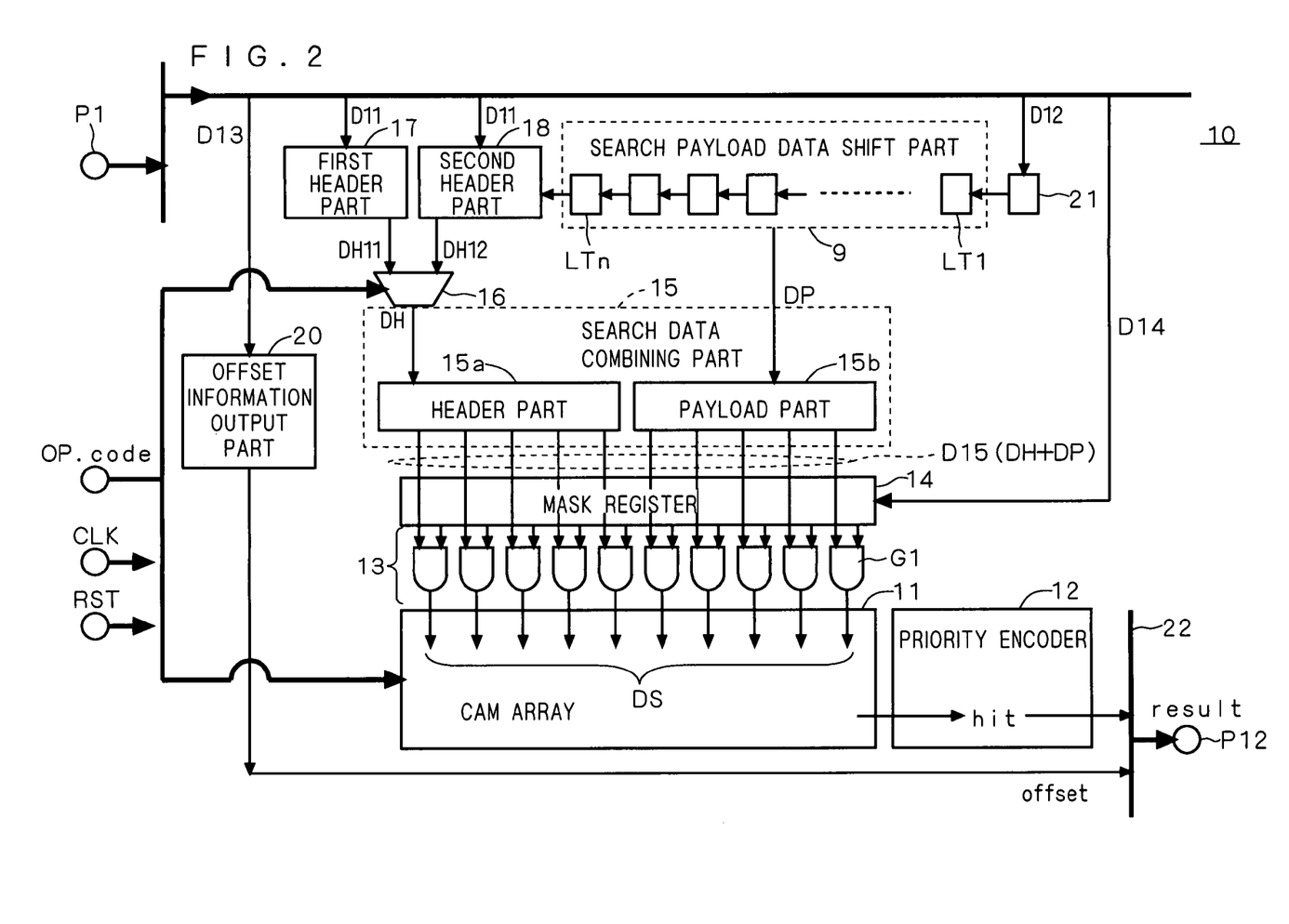
FIG. 2 is a block diagram showing the configuration of an integrated circuit containing a CAM in the first preferred embodiment.

FIG. 2 is a block diagram showing the configuration of an integrated circuit containing a CAM that is the integrated circuit with associated memory function of the first preferred embodiment. As shown in FIG. 2, all or part of header data D11 corresponding to a header portion in packet data is stored, via an input terminal P1 that can input data in 1-byte units, in a first header part 17 and a second header part 18, respectively. For example, the header data of second to fourth layers in network layers are stored in the first header part 17, and the header data of the second layer is stored in the second header part 18.

Further, via the input terminal P1, payload data D12 corresponding to a payload portion (a user information portion) in the packet data is given to a latch part 21, and offset data D13 indicating the shift status of the payload data D12 is given to an offset information output part 20. In addition, where necessary, setting data D14 is given from the input terminal P1 to a mask register 14.

Figure 3:
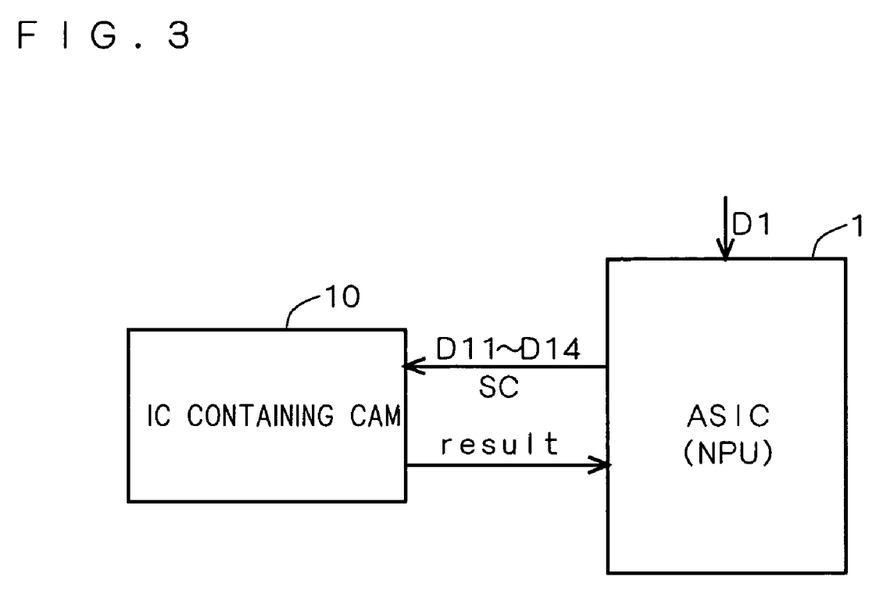
FIG. 3 is an explanatory diagram showing the relationship between the integrated circuit containing a CAM and an ASIC.

FIG. 3 is an explanatory diagram showing the relationship between an integrated circuit containing a CAM 10 and an ASIC 1. As shown in FIG. 3, the ASIC 1 receives packet data D1, and classifies the packet data D1 into header data D11 and payload data D12. Then, the ASIC 1 gives all or part of the header data D11 to the first header part 17 and the second header part 18, and gives the payload data D12 to the latch part 21 at the front stage of the search payload data shift part 9.

Additionally, the ASIC 1 outputs a control signal SC (containing an operation code OP.code, etc.) for controlling the operation of the integrated circuit containing a CAM 10, and outputs the offset data D13 to the offset information output part 20, while incrementing by one from an initial value "0", in synchronization with one character input of the payload data D12. Further, where necessary, the ASIC 1 gives the setting data D14 to set the data of the mask register 14 to the integrated circuit containing a CAM 10.

On the other hand, the integrated circuit containing a CAM 10 outputs the ASIC 1 a comparison result signal 'result' that contains a hit signal 'hit' indicating information about match/mismatch with entry data in the CAM array 11, and an offset signal 'offset' indicating the shift status at that time. Alternatively, although FIG. 3 shows the ASIC 1, the operation of the ASIC 1 may be performed by the NPU that is another control part.

Referring again to FIG. 2, first header data DH11 and second header data DH12, which are outputted from the first header part 17 and the second header part 18, respectively, are fetched by a selector 16. The selector 16 then outputs one of the header data DH11 and DH12, as header data DH. The content to be selected by the selector 16 is controlled by the operation code OP.code contained in the control signal SC from the ASIC 1.

The search payload data shift part 9 has n latch parts, LT1 to LTn (n≧2), each of which can store 1-byte latch data.

The latch parts LT1 to LTn execute shift operation in synchronization with a clock CLK provided from the exterior. That is, the latch part LT1 fetches the latch data stored in the latch part 21, and the latch parts LT2 to LTn fetch the latch data of the latch parts LT1 to LT(n−1), respectively. Data of n-byte (8-bit (a predetermined bit)×n (a predetermined length)), which is latched by the latch parts LT1 to LTn within the search payload data shift part 9, becomes search payload data DP.

A header part 15a of a search data combining part 15 fetches the header data DH, and a payload part 15b fetches the search payload data DP. The search data combining part 15 combines the two data and outputs it as combined search data D15 (DH+DP).

In an AND gate group 13 composed of a plurality of AND gates G1, the combined search data D15 is given to one input of each of the plurality of AND gates G1, whereas the mask data stored in the mask register 14 is given to the other input of the plurality of AND gates G1. Data outputted from each of the AND gates G1 of the AND gate group 13 becomes search object data DS.

The CAM array 11 stores a plurality of entry data DE that can be compared with the search object data DS. That is, each entry data DE is composed in not less than a byte count corresponding to the search object data DS.

If the search object data DS matches one of the plurality of entry data DE, the CAM array 11 outputs a hit signal 'hit' that contains information indicating the match, and information indicating the matched entry data DE with use of an address or the like. If it does not match with any of the entry data DE, the CAM array 11 outputs a hit signal 'hit' that contains information indicating that no match exists. The hit signal 'hit' also contains information indicating as to whether there are two or more matched entry data DE.

Consider now the case where the CAM array 11 has a memory size of 1M bits and enables two programs of an entry having 144b(bit)×8K in lookup length, and an entry having a 288b×4K in lookup length. In the case of the entry of 144b×8K, the CAM array 11 outputs information having a total of 15 bits as a hit signal 'hit', which consists of 13 bits of output information (information indicating any one of 8K entry), a flag indicating whether the search result is hit (match) or miss (mismatch), and a flag indicating that there are two or more search results.

It is able to control by an indication based on an operation code OP.code whether the CAM array 11 performs operation of either of read/write processing of entry data DE, or search processing of search object data DS and entry data DE.

If a hit signal 'hit' indicates matches with two or more entry data DE, a priority encoder 12 selects one entry data DE according to a predetermined priority, and outputs an output bus 22 a hit signal 'hit' indicating a match only with the one entry data DE. In FIG. 2, there is shown schematically the case where a hit signal 'hit' indicates a match with one entry data DE, and the hit signal 'hit' in the CAM array 11 is directly outputted to the output bus 22.

The offset information output part 20 outputs the output bus 22 the offset data D13 when the above-mentioned search payload data DP is set as an offset signal 'offset', in synchronization with the timing at which the comparison result of the search payload data DP stored in the search payload data shift part 9 occurs as a comparison result 'result'.

As a result, the hit signal 'hit' outputted onto the output bus 22 and the offset signal 'offset' are outputted as a comparison result signal 'result', via an output terminal P12 to the ASIC 1 in the exterior.

Although the connection relationship of a clock CLK and a reset signal RST to respective components (the CAM array 11 and the like) on the integrated circuit containing a CAM 10 is not shown by a figure, the clock CLK and the reset signal RST are given to the respective components, so that the respective components operate in synchronization with the clock CLK, and are initialized on the input of an active reset signal RST.

<Operation>

Figure 4:
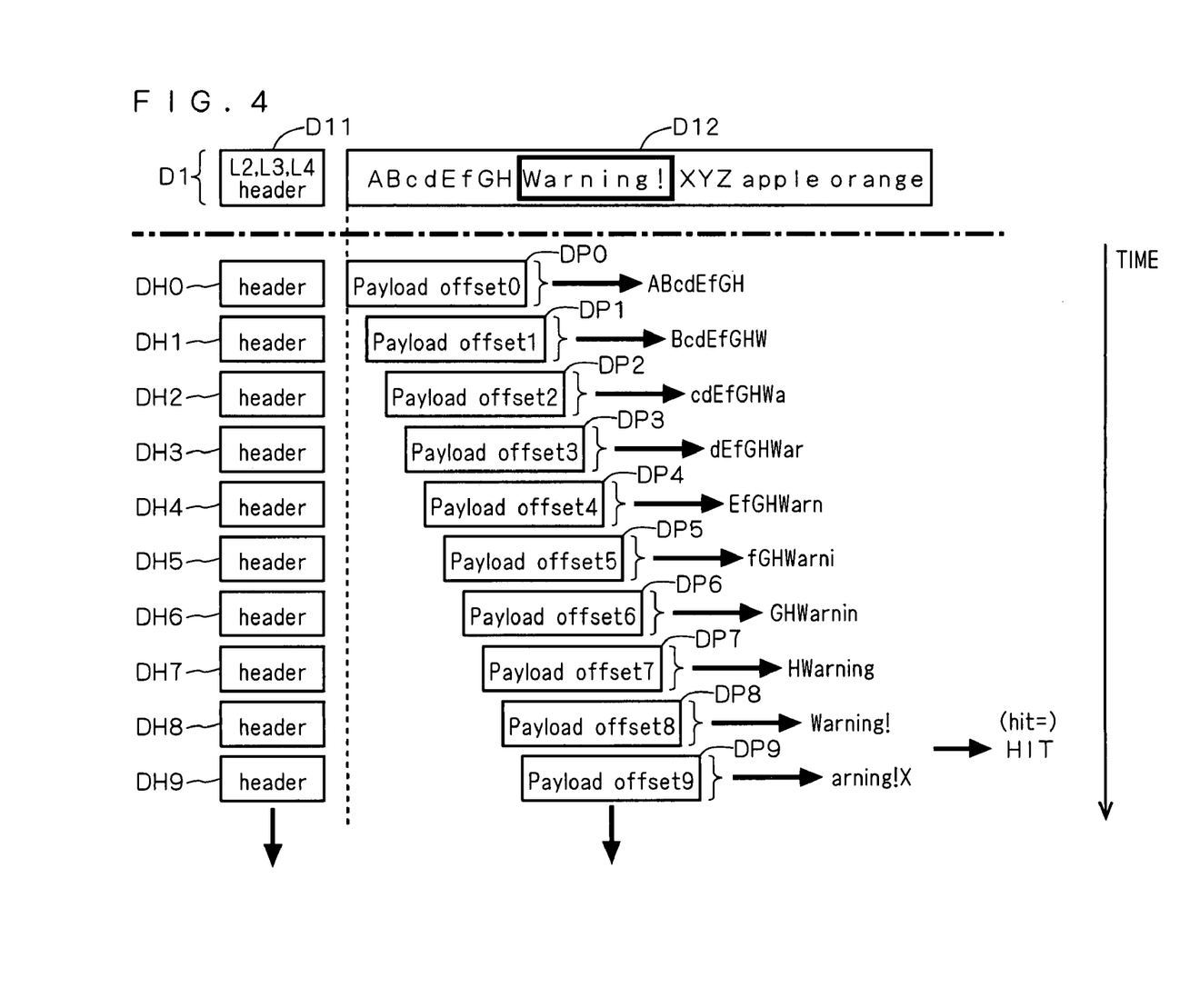
FIG. 4 is an explanatory diagram showing schematically signature matching search operation of the integrated circuit containing a CAM in the first preferred embodiment.

FIG. 4 is an explanatory diagram showing schematically the signature matching search operation of the integrated circuit containing a CAM 10 of the first preferred embodiment. In the example of FIG. 4, there is shown the case where the latch part LT of the search payload data shift part 9 has a latch number, n="8".

Referring to FIG. 4, header data D11 in packet data D1 is set as header data DH (DH0 to DH9) of search object data DS, through the first header part 17 or the second header part 18, the selector 16, the header part 15a, the mask register 14, and the AND gate group 13. As shown in FIG. 4, the header data DH changes from the header data DH0 to DH9 with an elapse of time, in synchronization with a clock CLK. However, the header data is practically fixed on either of the first header data DH11 or the second header data DH12.

On the other hand, payload data D12 ("ABcdEfGH . . . ,") is shifted in one character (1-byte) units from the first eight characters "ABcdEfGH," and search payload data DP is changed to search payload data DP0 to DP9 with an elapse of time, in synchronization with the clock CLK. Specifically, the search payload data DP0 changes to "ABcdEfGH" (no shift (offset), "offset0"); the search payload data DP1 changes to "BcdEfGHW" (one shift, "offset1"); the search payload data DP2 changes to "cdEfGHWa" (two shifts, "offset2"), . . .

Here, assuming that "Warning!" is registered in the portion corresponding to the search payload data DP, as entry data DE of the CAM array 11. If the search payload data DP8 is "Warning!" (eight shifts, "offset8"), the hit signal 'hit' becomes active (which is expressed in capital "HIT" in FIG. 4).

As a result, it is able to make signature matching search for searching the fact that the character string "Warning!" is contained in the payload data D12, as a comparison result signal 'result'.

Figure 5:
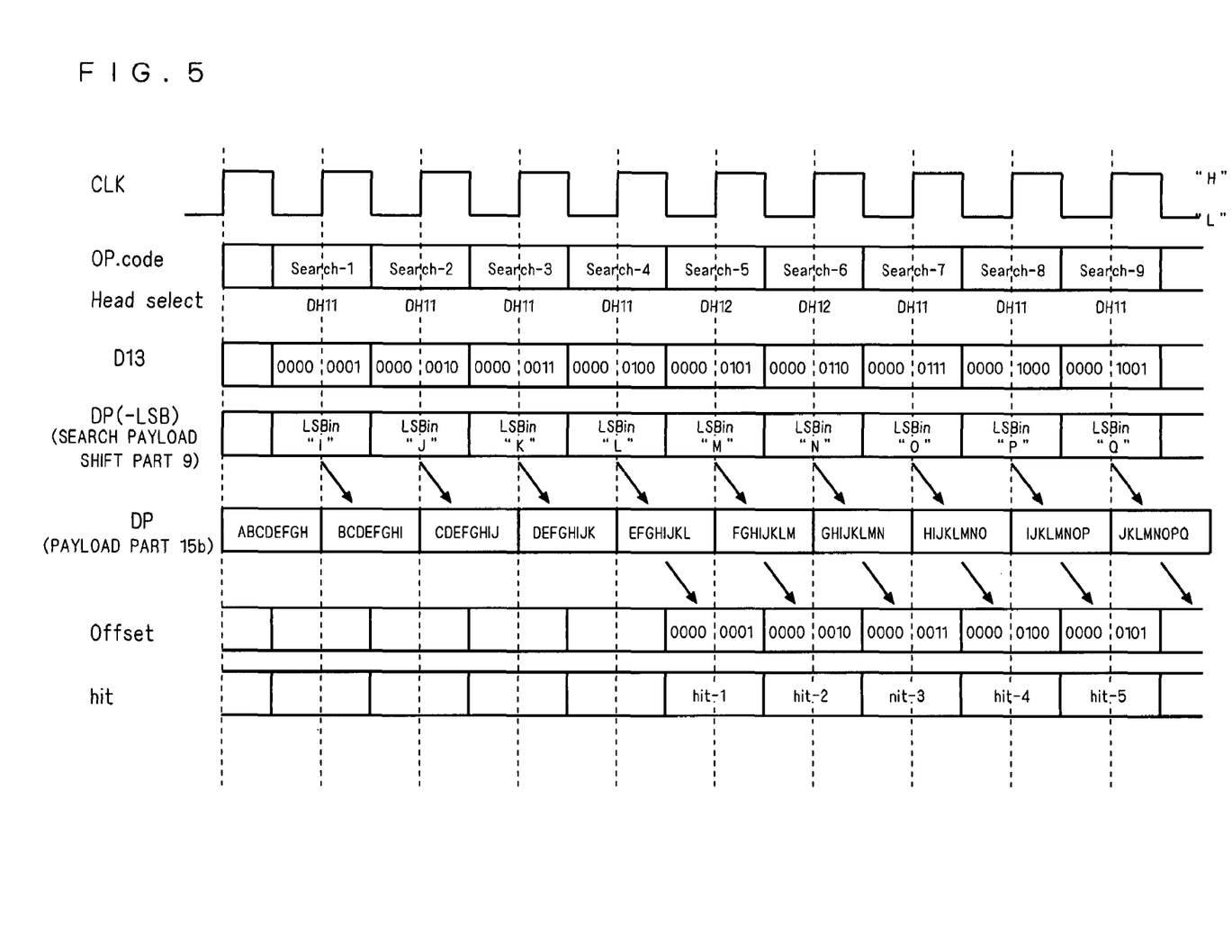
FIG. 5 is a timing chart showing details of the operation of the integrated circuit containing a CAM in the first preferred embodiment.

FIG. 5 is a timing chart showing details of the operation of the integrated circuit containing a CAM 10 of the first preferred embodiment. Like FIG. 4, FIG. 5 also shows the case where the latch part LT of the search payload data shift part 9 has a latch number, n="8". The example of FIG. 5 shows the case where the payload data D12 is "ABCDEFGHIJKLMNOPQ . . . ,".

As shown in FIG. 5, respective operations are executed in synchronization with the rise "H" or the fall "L" of a clock CLK. An operation code OP.code contained in a control signal SC is used to control the selector 16. The example of FIG. 5 shows the case where first header data DH11 is selected at the execution of first to fourth searches and seventh to ninth searches, and second header data DH12 is selected at the execution of fifth and sixth searches. Here, the search operation time to search payload data DP after the execution of the ith ($i \geq 1$) shift operation is defined as the ith search operation time.

Offset data D13 is incremented by "1" in synchronization with the number of searches i, and then outputted to the offset information output part 20. That is, when the least significant byte LSB of the search payload data DP is "I", it is set to "1" (00000001). Thereafter, the offset data D13, the content of which is incremented by "1" in synchronization with the clock CLK, is given to the offset information output part 20.

The search payload data DP is fetched into the search payload data shift part 9 in synchronization with the fall "L" of the clock CLK, and then inputted to the payload part 15b in synchronization with the next rise "H" of the clock CLK.

Then, after a delay of the time (latency) caused by pipeline processing in each of the search data combining part 15, the mask register 14, the AND gate group 13, the CAM array 11 and the priority encoder 12, a hit signal 'hit' is outputted from the priority encoder 12. In FIG. 5, there is shown the case where the above-mentioned latency is 4 clocks. That is, the result of the ith search processing (Search-i) is outputted as a hit signal (hit-i) with a 4-clock delay.

The offset information output part 20 causes the offset data D13 to delay 4 clocks and then outputs it as an offset signal 'offset'. As a result, an offset signal 'offset' indicating a shift status i is outputted in synchronization with the ith hit signal (hit-i). Therefore, the shift status during the search processing corresponding to the hit signal 'hit' can be recognized accurately from the offset signal 'offset'.

Thus, the integrated circuit containing a CAM 10 of the first preferred embodiment has the signature matching search function to the header data D11 and the payload data D12. This enables to reduce the load imposed on the control part by the amount that the control part such as the ASIC 1 or the NPU need not perform signature matching search processing.

Further, since the search payload data shift part 9 performs data input in 1-byte units in the first preferred embodiment, the band ratio consumed on a data pin during one search time is one byte/one search. In contrast, it has conventionally been a general manner that all the data strings to be searched are inputted by data pin input, and therefore, the band ratio thereof is n bytes/one search. Accordingly, the integrated circuit containing a CAM 10 of the first preferred embodiment also produces the effect of reducing the band one-nth.

In addition, the AND gate group 13 and the mask register 14 are able to arbitrarily perform mask setting to combined search data D15 in order to determine search object data DS. Setting data D14 from the input terminal P1 is used to set writing to the mask register 14.

For example, if the AND gate group 13 and the mask register 14 are adapted to execute mask processing of all of search payload data DP, this is usable as address search application that is the function of a normal router based on header data DH. Alternatively, if both of header data DH and search payload data DP are made valid, it is able to use as an IDS with signature matching function, in addition to the normal router function. Accordingly, mass production is realized because of a wider use, which is obtainable by the applicability even for IDS, in addition to the router function. This also produces the effect of reducing manufacturing cost by mass production.

The bit length of a header data portion (the header length) in search object data DS, and the bit length of a payload data portion (the payload length) can be set variably by the search data combining part 15, the mask register 14 and the AND gate group 13. For example, when the bit length of search object data DS is 288 bits, it is changeable to a first combination in which the header length is 32 bits and the payload length is 256 bits, or a second combination in which the header length is 128 bits and the payload length is 160 bits, or a third combination in which the header length is 0 bit and the payload length is 288 bits. In order to implement the first to third combinations, it is essential that the number of storage bits of at least one of the first and second header parts 17 and 18, and the number of storage bits of the header part 15a be set to 128 bits or more; and that the number of storage bits of the search payload data shift part 9 and the number of storage bits of the payload part 15b be set to 288 bits or more.

The reason why the header length and the payload length are made variable as described above is that it is necessary to comply with the case where the header length required is different for different network layers to be searched. For example, the header length of 32 bits is sufficient when a network layer to be searched is the third layer L3, however, the fourth layer or the like calls for a longer header length.

Second Preferred Embodiment

<Principle>

Figure 6:
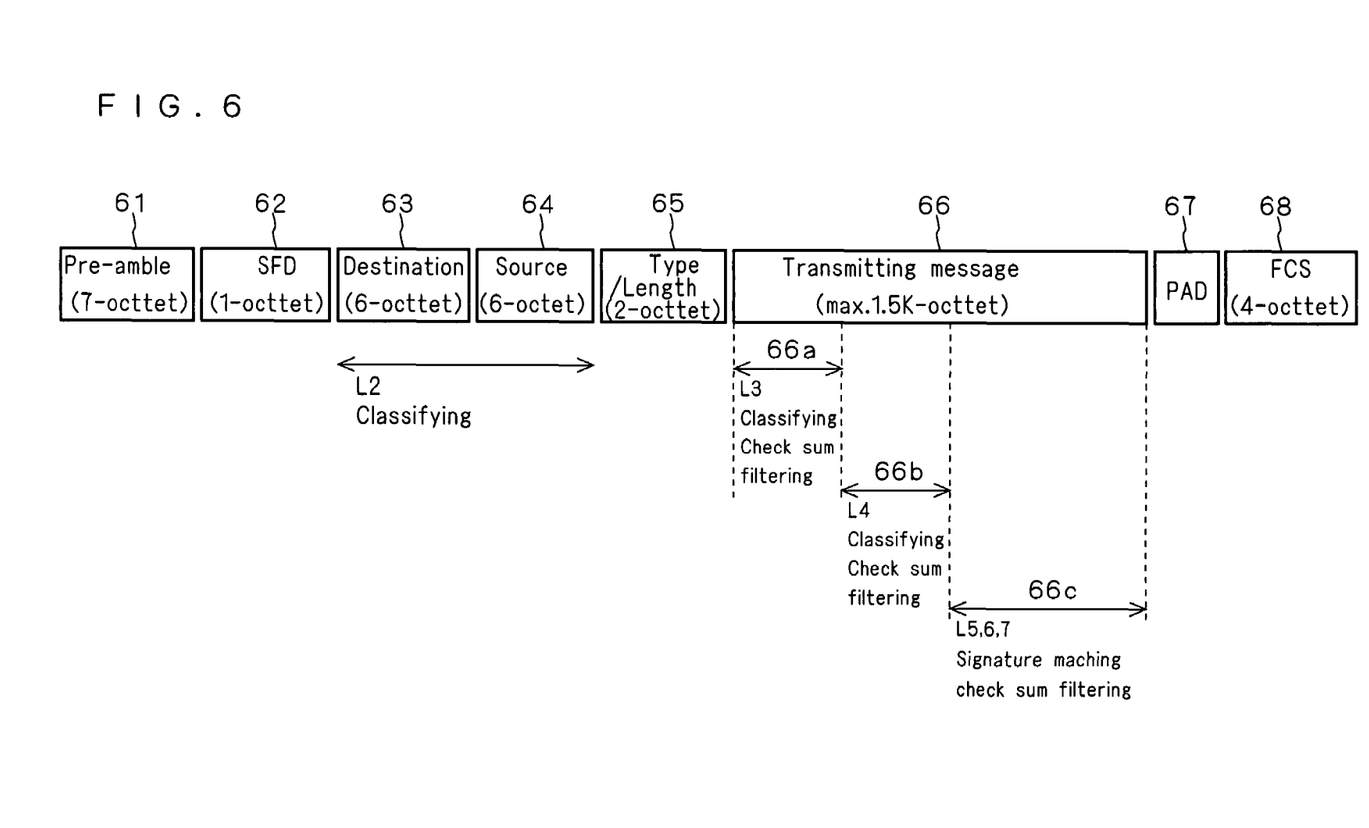
FIG. 6 is an explanatory diagram showing a packet data structure.

FIG. 6 is an explanatory diagram showing a packet data structure. As shown in FIG. 6, packet data is composed of preamble information 61, start frame delimiter (SFD) information 62, destination information 63, source information 64, type/length information 65, transmitting message 66, padding (PAD) data 67, and frame check sequence (FCS) information 68. In FIG. 6, the characters "octet" denotes a data length, taking 8-bit (1-byte) as a unit.

Data of a second layer L2 of network layers corresponds to the destination information 63 and the source information 64, based on which classify processing such as packet flow identification and class destination is performed.

Third layer data 66a of the transmitting message 66 is subjected to classify processing, checksum filtering processing and the like. Fourth layer data 66b is subjected to classify processing, checksum filtering processing and the like. Fifth to seventh data 66c are subjected to signature matching processing, checksum filtering processing and the like, which are executed by the integrated circuit containing a CAM 10 of the first preferred embodiment.

Since a 4-byte error detecting code is set to the FCS information 68, it is detectable whether a packet is normally received or not, based on the FCS information 68.

The portion of the transmitting message 66 which corresponds to respective network layers has also the checksum function to detect whether this packet is normally received or not. In other words, the respective network layers of the transmitting message 66 have the function to split information into a plurality of chunks in 16-bit units, and to perform add operation of respective chunks and store the low-order 16 bits or less of the respective addition results as checksum information that is part of the information of the transmitting message 66. Therefore, if a transmitting message 66 is created on the sending side by adding checksum information per hierarchy of the network layers, at which hierarchy an error occurs can be detected on the receiving side by performing checksum calculation per hierarchy, and comparing the checksum result with checksum information, on the receiving side.

Figure 7:
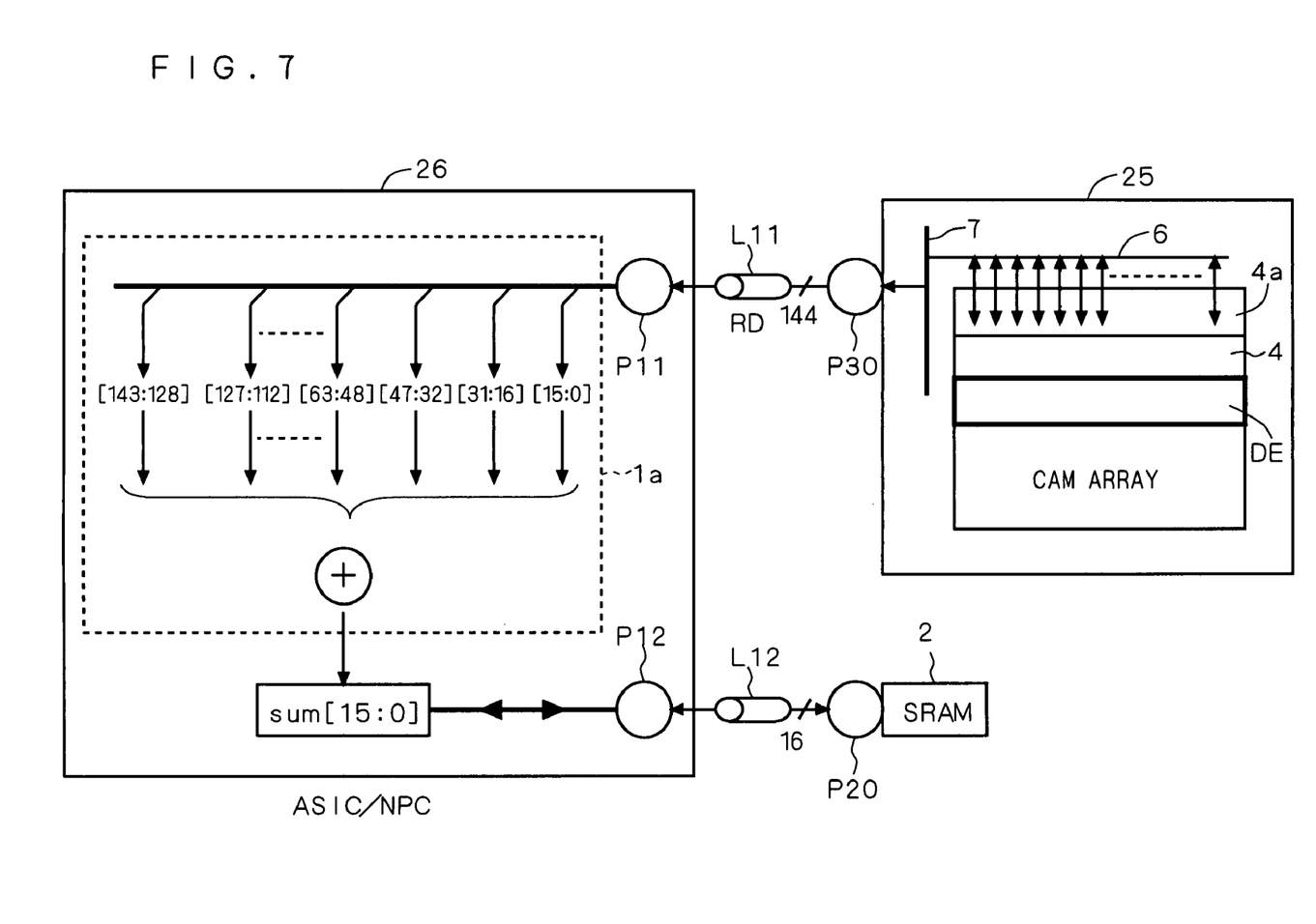
FIG. 7 is an explanatory diagram showing a specific configuration to realize a conventional checksum operation.

FIG. 7 is an explanatory diagram showing a specific configuration to implement a conventional checksum operation. As shown in FIG. 7, an integrated circuit containing a CAM 25 has a CAM array 4, and outputs entry data DE of the CAM array 4, as read data RD, from an output terminal P30 via a dedicated bus 6 and a common bus 7. The read data RD is then inputted to an input part P11 of an ASIC 26 via a signal line L11 of 144-bit length.

The ASIC 26 has a checksum addition function 1a that can be implemented by hardware or software. The checksum addition function 1a reads the data of the kth layer (k is any one of 3 to 7), as read data RD, and finds the low-order 16 bits of the sum per chunk in 16-bit units ([15:0], [31:16], [47:32], [63:48], . . . , [127:112], [143:128]), thereby obtaining a final checksum result 'sum[15:0]'. The ASIC 26 fetches the checksum information of the kth layer, which is already retained in an SRAM 2, via a 16-bit signal line L12 and an input/output terminal P12. The ASIC 26 can detect whether the receiving of the kth layer is normally carried out or not, based on the comparison result between the final checksum result sum[15:0] of the kth layer and the checksum information of the kth layer.

However, having the ASIC 26 entirely perform checksum operation processing imposes load on the ASIC 26, as previously described.

For this reason, like the integrated circuit containing a CAM 10 of the first preferred embodiment in which the header portion and the payload portion of packet data are inputted to the CAM array, the second preferred embodiment enables to implement the above-mentioned checksum filtering function in the following configuration. Specifically, in an integrated circuit containing a CAM that can fetch the payload portion into the CAM array, third layer data 66a and fifth to seventh layer data 66c of a transmitting message 66 are respectively fetched into the CAM array, and the respective checksum calculation results of these data 66a to 66c are also calculated within the integrated circuit containing a CAM.

<Configuration>

Figure 8:
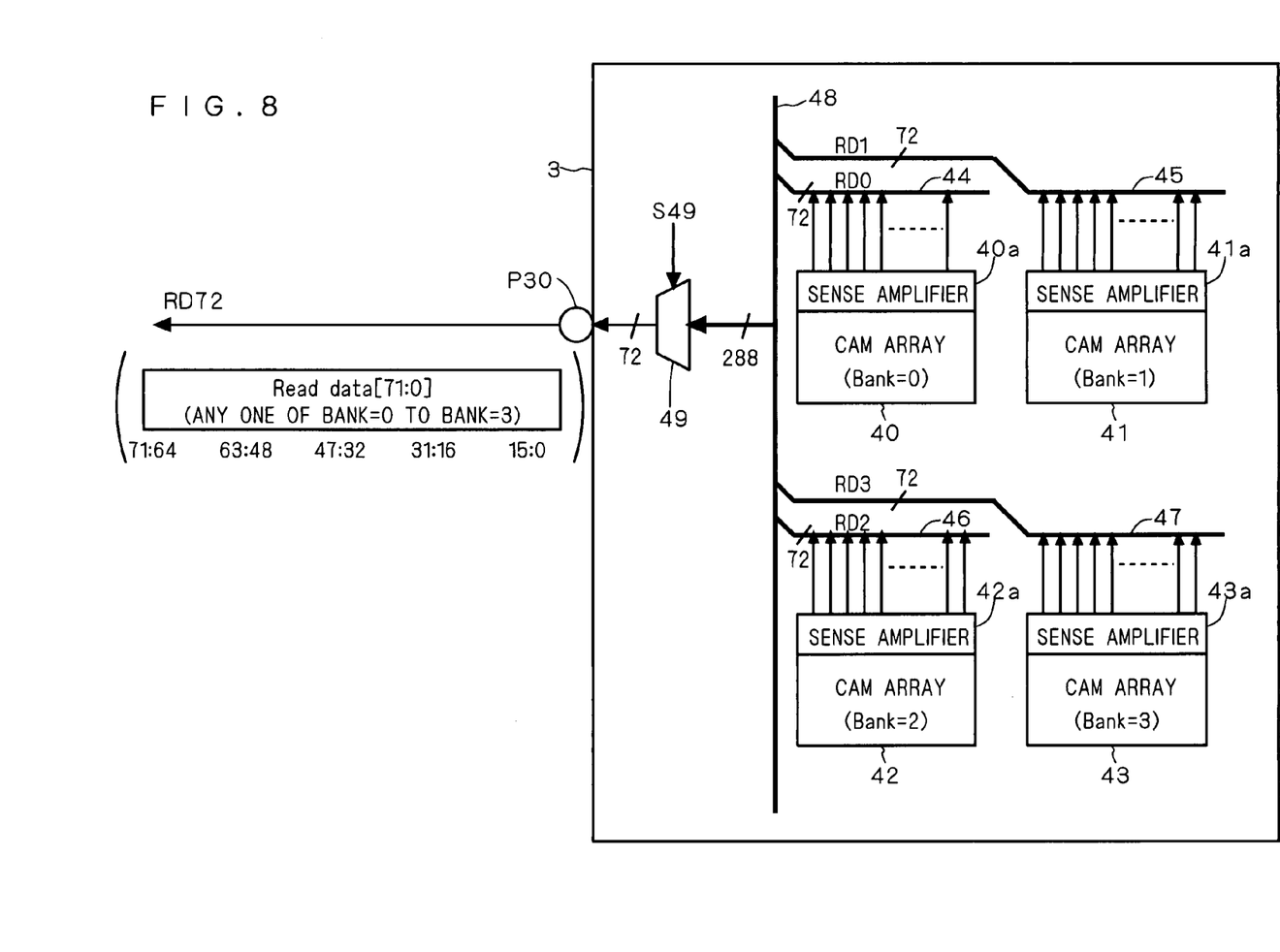
FIGS. 8 and 9 are explanatory diagrams showing read data output function of an integrated circuit containing a CAM in accordance with a second preferred embodiment of the present invention.
Figure 9:
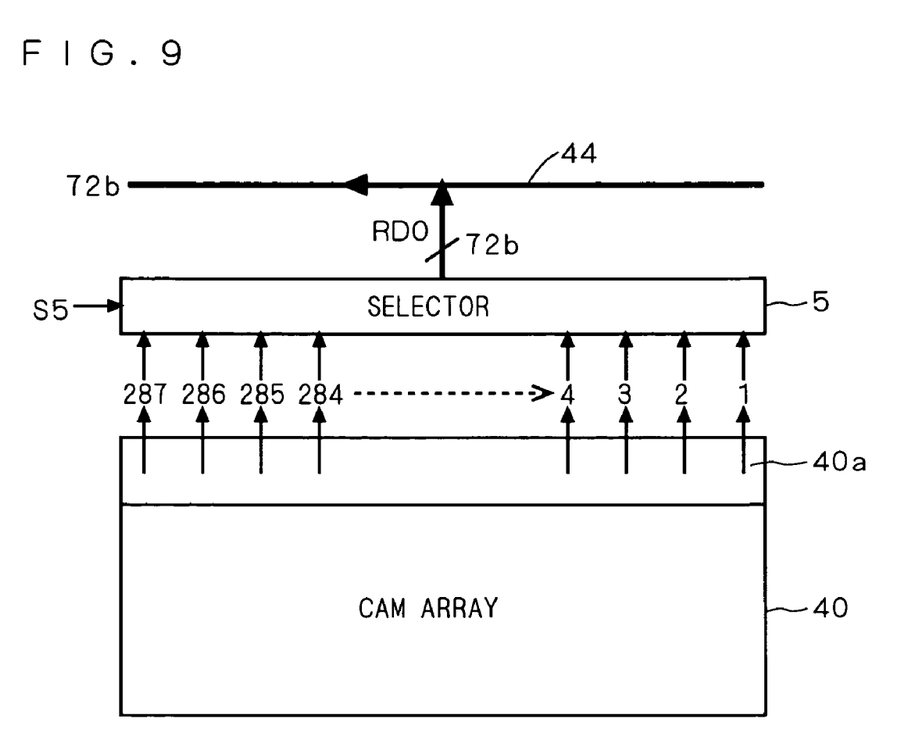

FIGS. 8 and 9 are explanatory diagrams showing a read data outputting function of an integrated circuit containing a CAM 3 of the second preferred embodiment.

Referring to FIGS. 8 and 9, there are disposed CAM arrays 40 to 43 corresponding to partial associated memory parts that are classified into four banks (Bank=0 to Bank=3), and 72-bit read data RD0 to RD3 from sense amplifiers 40a to 43a of the CAM arrays 40 to 43 are read onto dedicated buses 44 to 47.

For example, as shown in FIG. 9, if the CAM array 40 has a 288-bit entry data length, a selector 5 for restricting the output of 288 bits of the sense amplifier 40a to 72 bits is disposed at an output part of the sense amplifier 40a, so that 72-bit read data RD0 is outputted from the selector 5. The selector 5 is controlled by a selection signal S5 that is part of a control signal SC outputted from the ASIC 1. The selector 5 is not shown in FIG. 8. Even in the case where the CAM arrays 41 to 43 have a 288-bit entry data length, the configuration thereof is the same as that in FIG. 9.

The dedicated buses 44 to 47 are connected to a 288-bit common bus 48, and read data RD0 to RD3 are inputted to a selector 49. Based on a selection signal S49 that is part of the control signal SC of the ASIC 1 and the like, the selector 49 outputs, through an output terminal P30, any one of the read data RD0 to RD3, as read data RD72.

Figure 10:
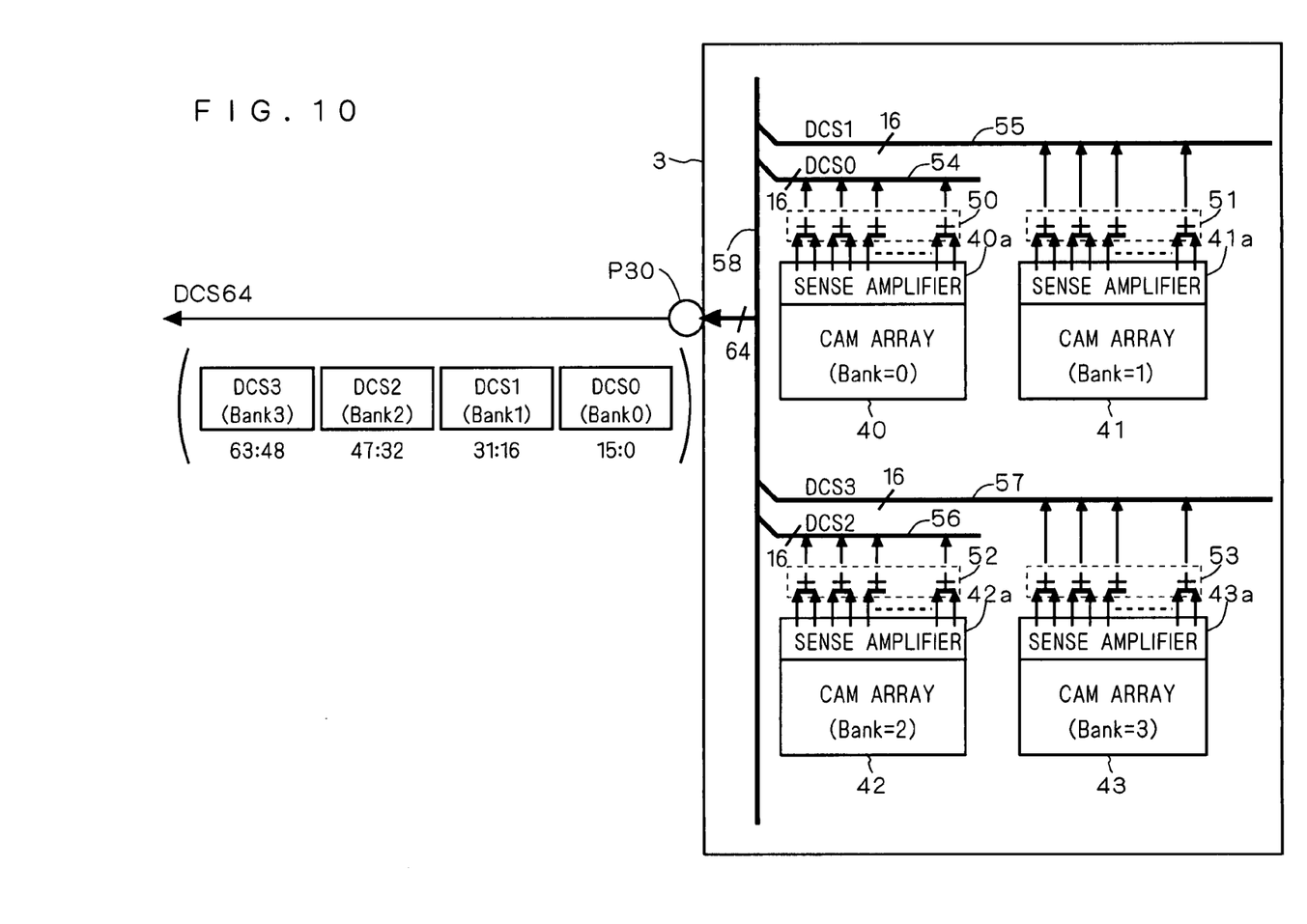
FIG. 10 is an explanatory diagram showing checksum operation result output function in the integrated circuit containing a CAM of the second preferred embodiment.

FIG. 10 is an explanatory diagram showing a checksum operation result outputting function in the integrated circuit containing a CAM 3 of the second preferred embodiment.

Referring to FIG. 10, checksum operation parts 50 to 53 corresponding to the four partial checksum operation parts are disposed at the output parts of sense amplifiers 40a to 43a of CAM arrays 40 to 43. The checksum operation parts 50 to 53 classify the output data of the sense amplifiers 40a to 43a into a plurality of chunks in 16-bit units, respectively, and find the low-order 16 bits of the respective sum of the 16-bit data of the plurality of chunks, as checksum operation results DCS0 to DCS3, and then outputs them to dedicated buses 54 to 57, respectively. These checksum operation results DCS0 to DCS3 correspond to a plurality of partial checksum operation results.

Data input of respective network layers that are checksum operation result objects is attainable, for example, by doing similarly to the normal writing under the control of the ASIC 1. Data output of the respective network layers is attainable, for example, by reading, from the sense amplifier, the checksum operation object data already written, as when performing the normal reading.

The dedicated buses 54 to 57 are synthesized on a common bus 58, and the data on the common bus 58 is outputted as a checksum operation result DCS64, from an output terminal P30. That is, the checksum operation result DCS64 is set from the low-order in the order named: the checksum operation results DCS0, DCS1, DCS2, and DCS3. In other words, the checksum operation result DCS64 is an aggregate of the checksum operation results DCS0 to DCS3. Since the output terminal P30 permits 72-bit output, the high-order 8 bits are treated as reserved data fixed at a suitable value.

Figure 11:
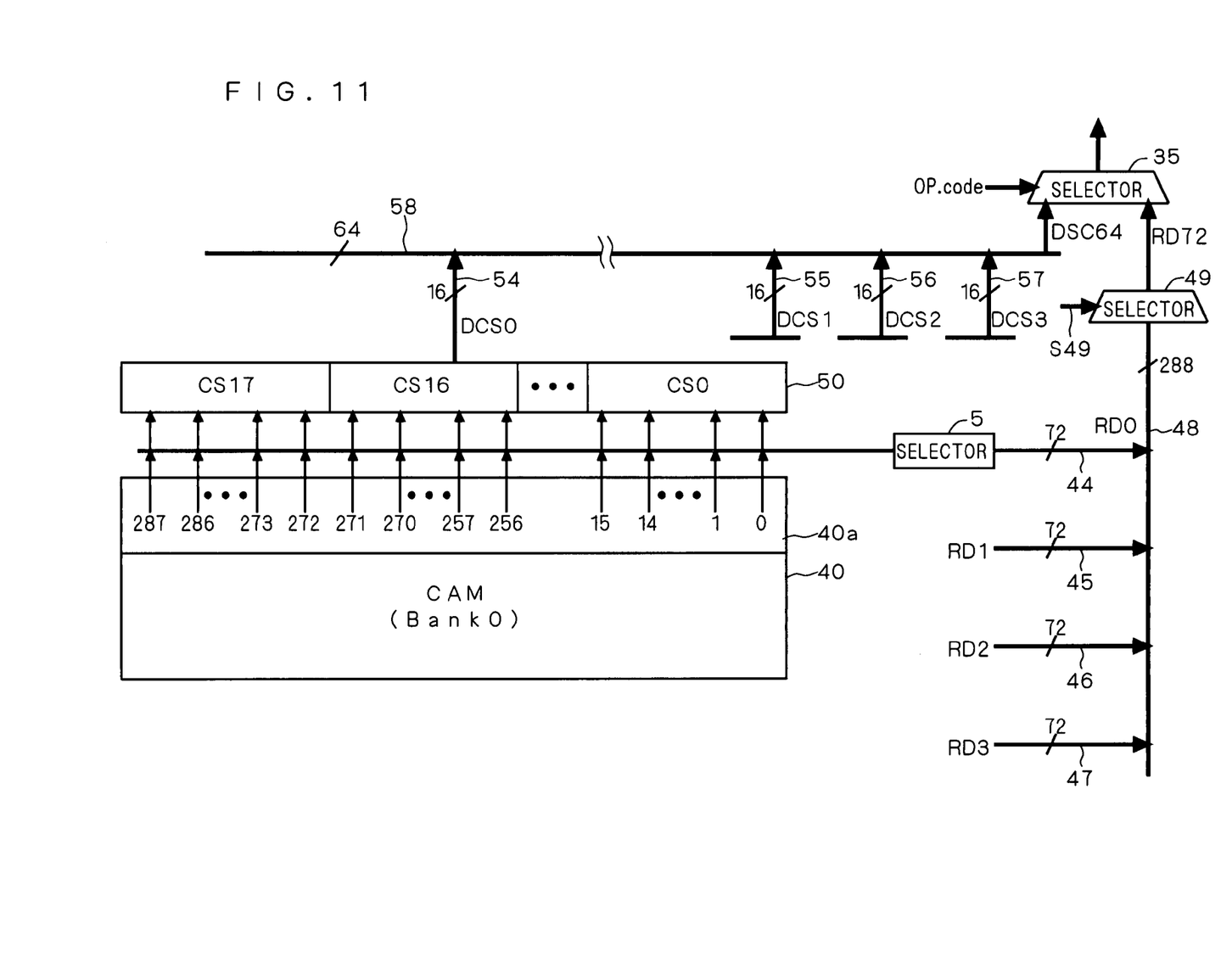
FIG. 11 is an explanatory diagram showing the surroundings of a CAM array in the integrated circuit containing a CAM of the second preferred embodiment.

FIG. 11 is an explanatory diagram showing the surroundings of the CAM array 40 in the integrated circuit containing a CAM 3 of the second preferred embodiment. The integrated circuit containing a CAM 3 of the second preferred embodiment has both of the normal data readout function shown in FIGS. 8 and 9, and the checksum operation result outputting function shown in FIG. 10. This configuration is specifically shown in FIG. 11.

Referring to FIG. 11, 288-bit data from the sense amplifier 40a of the CAM array 40 is read into a checksum operation part 50. The checksum operation part 50 can be classified in 16-bit units into 18 chunks of CS0 to CS17, each of which receives the corresponding 16-bit data output from the sense amplifier 40a. For example, the chunk CS0 reads 0 to 15 bits information of the sense amplifier 40a, the chunk CS16 read 256 to 271 bits information of the sense amplifier 40a, and the chunk CS17 reads 272 to 287 bits information of the sense amplifier 40a.

The checksum operation part 50 outputs a dedicated bus 54 the low-order 16 bits of the sum of the 16-bit data stored in the chunks CS0 to CS17, as a checksum operation result DCS0 of the CAM array 40. Checksum operation results DCS1 to DCS3 of the CAM arrays 41 to 43 are also outputted similarly to dedicated buses 55 to 57, respectively, and a 64-bit checksum operation result DCS64 is inputted from the common bus 58 to a selector 35.

On the other hand, the 288-bit output of the sense amplifier 40a is also inputted to the selector 5, in addition to the checksum operation part 50, and then outputted to a common bus 48, as 72-bit read data RD0, as shown in FIG. 9. Read data RD1 to RD3 of the CAM arrays 41 to 43 are also outputted similarly to dedicated buses 45 to 47, and then synthesized into 288 bits on the common bus 48. Any one of the read data RD0 to RD3 is selected by a selector 49, and then outputted to the selector 35, as 72-bit read data RD72.

Based on an operation code OP.code contained in a control signal SC, the selector 35 outputs the read data RD72 during the normal reading, and outputs the checksum operation result DCS64 during the checksum operation.

Thus, the integrated circuit containing a CAM 3 of the second preferred embodiment has the checksum operation function. Therefore, the control part, such as the ASIC 1 and the NPU, need not execute most of the checksum operation processing in order to detect the normal receiving of the data of each network layer. This permits a large reduction in the load of the control part.

In addition, the second preferred embodiment has the configuration in which the checksum operation results DCS0 to DCS3 of the four CAM arrays 40 to 43 can be batch-outputted. This enables to exhibit execution performance four times greater than the case of independently finding the checksum of the CAM arrays 40 to 43, respectively.

Additionally, it is of course able to obtain an integrated circuit containing a CAM that can execute both of the signature matching function and the checksum operation function, by combining the first and the second preferred embodiments.

While the invention has been shown and described in detail, the foregoing description is in all aspects illustrative and not restrictive. It is therefore understood that numerous modifications and variations can be devised without departing from the scope of the invention.

What is claimed is:

1. An integrated circuit with associated memory function comprising:
    a payload data shift part for receiving input data containing payload data and fetching said payload data in a predetermined bit unit to obtain search payload data composed of the product of a predetermined bit of the predetermined bit unit and a predetermined length while shifting said payload data in said predetermined bit unit; and
    an associated memory part for storing at least one entry data and outputting a comparison result signal indicating the presence or absence of a match by comparing search object data being data related to said search payload data with said at least one entry data.

2. The integrated circuit with associated memory function according to claim 1, wherein
    said input data further contains header data,
    said integrated circuit further comprising:
    a search data combining part for obtaining combined search data by combining said head data and said search payload data; and
    a search data mask part for obtaining said search object data by selectively causing said combined search data to be valid.

3. The integrated circuit with associated memory function according to claim 1, wherein
    said comparison result signal contains offset information indicating the shift status of said search payload data.

4. The integrated circuit with associated memory function according to claim 2, wherein
    said comparison result signal contains offset information indicating the shift status of said search payload data.

* * * * *